United States Patent [19]

Miura

[11] 4,025,857
[45] May 24, 1977

[54] TELEVISION TUNER CIRCUIT

[75] Inventor: Katsuhiko Miura, Soma, Japan

[73] Assignee: Alps Electric Co., Ltd., Tokyo, Japan

[22] Filed: Mar. 17, 1975

[21] Appl. No.: 559,233

[30] Foreign Application Priority Data

Mar. 14, 1974 Japan .................. 49-29544[U]

[52] U.S. Cl. .................. 325/452; 325/459; 325/465; 334/56

[51] Int. Cl.² .................. H04B 1/06

[58] Field of Search .......... 325/452, 453, 459, 461, 325/464, 465, 376; 334/49, 56

[56] References Cited

UNITED STATES PATENTS

| | | |
|---|---|---|
| 2,530,329 | 11/1950 | Fyler ............... 325/465 |
| 2,806,945 | 9/1957 | Wingert ............ 334/56 |
| 2,841,655 | 7/1958 | Horowitz ........... 334/56 |
| 2,843,683 | 7/1958 | Lewis .............. 334/56 |

Primary Examiner—Benedict V. Safourek
Assistant Examiner—Michael A. Masinick
Attorney, Agent, or Firm—Guy W. Shoup

[57] ABSTRACT

In a VHF-UHF tuner, the signal from the VHF antenna is fed to a resonant circuit comprising a plurality of coils which are selectably shorted out by a channel selection switch to select the various channels. The output of the resonant circuit and the UHF IF signal are fed to a band switch integral with the channel selection switch. The channel selection switch is adapted to short out the coils of the resonant circuit when in the UHF position to attenuate the VHF channel 2 signal component and prevent interference thereof with the UHF IF signal and the production of a beat frequency signal.

8 Claims, 9 Drawing Figures

TELEVISION TUNER CIRCUIT

The present invention relates to an improved VHF-UHF television tuner circuit in which, when the channel selection switch is in the UHF position, the VHF channel 2 signal component is effectively attenuated to prevent interference thereof with the UHF IF signal.

Combination VHF-UHF television tuners are well known in the prior art in which the RF amplification stage is utilized for both the VHF signals and the UHF IF signal. A major problem, which is solved by the present invention, is that the frequency of the VHF channel 2 (54–60MHz) is very close to that of the UHF IF signal (41–47MHz), and that interference between the two signals results in the production of a beat frequency which is detrimental to the performance of the television set. In the prior art, a switch is provided to disconnect the UHF antenna from the VHF resonant circuit when the channel selection switch is in the UHF position. However, this arrangement is not sufficient to satisfactorily suppress the VHF channel 2 signal component due to inductive coupling across the switch contacts.

It is therefore an important object of the present invention to provide a television tuner circuit in which the VHF channel 2 signal component is satisfactorily attenuated when the channel selection switch is in the UHF position.

It is another object of the present invention to provide a television tuner which is adapted to short out coils of the VHF resonant circuit when the channel selection switch is in the UHF position.

It is another object of the present invention to provide a television tuner circuit adapted to tune the VHF resonant circuit to channel 12 when the channel selection switch is in the UHF position.

The above and other objects, features and advantages of the present invention will become clear from the following detailed description taken with the accompanying drawings, in which.

Figure 1:
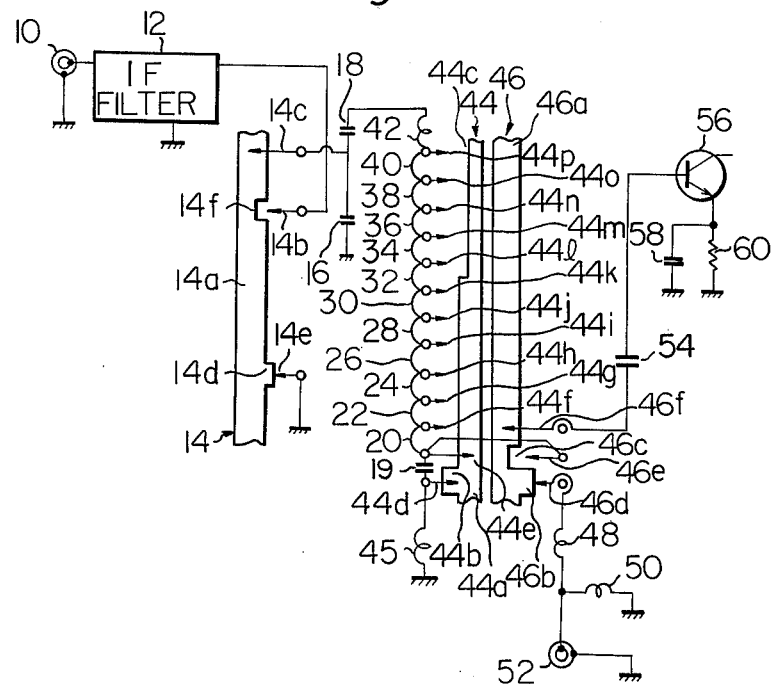
FIG. 1 is a schematic circuit diagram of a prior art television tuner circuit to which the present invention is applicable.

Referring now to FIG. 1, a prior art television tuner circuit comprises a VHF signal input terminal 10 connected to VHF antenna (not shown). The VHF input terminal 10 is connected through an IF filter 12 to a contact 14b of a rotary wafer switch 14. The switch element 14a of the switch 14 is shown as straight for simplicity of illustration, and is formed with a protrusion 14d and a cutout 14f. A contact 14c is always engaged with the switch element 14a, and another contact 14e is grounded and engagable with the protrusion 14d. The contact 14c is connected to the junction between capacitors 16 and 18 which are part of the VHF resonant circuit (no numeral) of the tuner circuit. The capacitor 16 is grounded. The capacitor 18 is grounded through inductors or coils 42, 40, 38, 36, 34, 32, 30, 28, 26, 24, 22 and 20 connected in series and a wave trap consisting of a capacitor 19 and a coil 45.

Another rotary wafer switch 44 comprises fixed contacts 44f to 44p connected to the junctions between the coils 20 to 42 respectively, a fixed contact 44e connected to the junction between the coil 20 and the capacitor 19 and a fixed contact 44d connected to the junction between the capacitor 19 and coil 45. The coils 20 to 40 constitute a tuning element with the contact 44p representing an input end or part and the contact 44e an output end of part. A switch element 44a is ganged to the element 14a for unitary rotation and is formed with a protrusion 44b and a cutout 44c. The contact 44e is always engaged with the element 44a.

Another rotary wafer switch 46 comprises fixed contacts 46d, 46e and 46f. The contact 46e is connected to the contact 44e of the switch 44. The contact 46d is connected through a coil 48 to a UHF IF signal input terminal 52, which is grounded through a coil 50. The contact 46f is connected to the base of an NPN transistor 56 through a coupling capacitor 54. The emitter of the transistor 56 is grounded through the parallel combination of a capacitor 58 and resistor 60 in a known manner. The transistor 56 is an RF amplifier, and the output thereof, constituting the output of the circuit shown, may be connected to a VHF mixer (not shown). The switch 46 further comprises a switch element 46a ganged to the elements 14a and 44a, which is formed with a protrusion 46b and a cutout 46c. The contact 46f always engages with the switch element 46a. The switch 46 is a band switch, the switch 44 is a channel selection switch and the switch 14 is a shorting switch.

To select the VHF channel 2 to 13, the switch elements 14a, 44a and 46a are rotated as a unit so that the protrusion 44b of the switch element 44a engages with the contacts 44e to 44p respectively. The contacts 14b and 14c of the switch 14 are connected together by the switch element 14a. The contact 14e is disengaged from the protrusion 14d and element 14a. The contact 44d engages with the switch element 44a only when the element 44a is in the channel 7 to 13 positions due to the cutout 44c to short out the capacitor 19. The contacts 46e and 46f are connected together through the switch element 46a, and the contact 46d is disengaged from the protrusion 46b and element 46a. The VHF input terminal 10 is thereby connected to the base of the transistor 56 through the IF filter 12, the contact 14b, the switch element 14a, the contact 14c, a plurality of the coils 42 to 20 which are not shorted out by the switch element 44a, one of the contacts 44f to 44p (except channel 12), the switch element 44a, the contact 44e, the contact 46e, the switch element 46a, the contact 46f and the capacitor 54. The resonant circuit comprising the capacitors 16 and 18, the coils 42 and 45 and the coils 20 to 40 which are not shorted out by the switch element 44a sustains oscillation at the selected channel frequency in a well known manner to tune in the selected channel.

To select the UHF band, the switch elements 14a, 44a and 46a are rotated to the positions illustrated in FIG. 1. The protrusion 46b engages with the contact 46d that the UHF IF input terminal 52 is connected to the base of the transistor 56 through the coil 48, contact 46d, switch element 46a, contact 46f and capacitor 54. The cutout 46c aligns with the contact 46e so that the contact 46e is disconnected from the switch element 46a. The cutout 14f aligns with the contact 14b of the switch 14 so that the contact 14b is disconnected from the switch element 14a. The protrusion 14d engages with the contact 14e to ground the switch element 14a. In this manner, the switch 14 is adapted to disconnect the VHF input terminal 10 from the resonant circuit described above. In practice, however, even the provision of grounding the switch element 14a is insufficient to prevent inductive coupling between the input terminal 10 and the resonant circuit. It will further be noticed that the resonant circuit is tuned to VHF channel 2 since none of the coils 20 to 42 are shorted out by the switch element 44a. The channel 2 component of the VHF input signal is therefore not effectively attenuated by the resonant circuit, and interferes with the UHF IF signal to produce a beat frequency signal.

Figure 2:
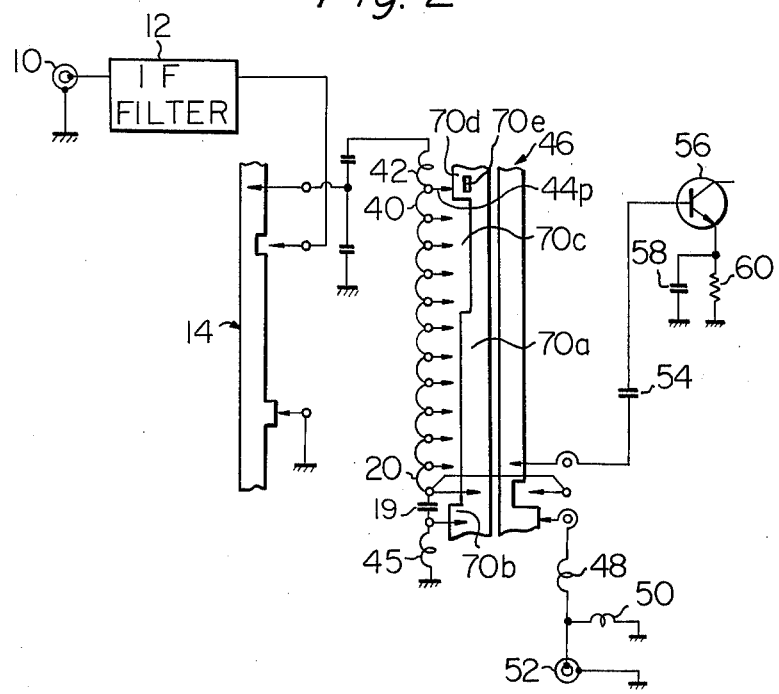
FIG. 2 is a schematic circuit diagram of an embodiment of a television tuner circuit according to the present invention.
Figure 5A:
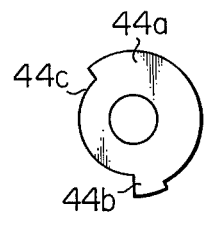
FIG. 5 is a plan view of various switch elements associated with the present invention.
Figure 5B:
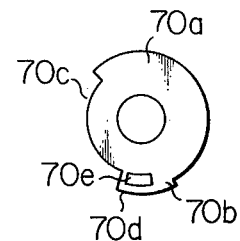
Figure 5C:
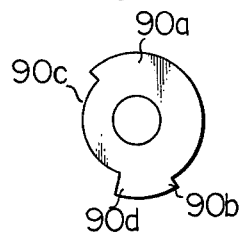

Referring now to FIG. 2, a tuner circuit embodying the present invention is identical to the circuit shown in FIG. 1 except that the switch element 44a is replaced by a switch element 70a. As shown in FIGS. 5a and 5b, the switch element 70a is formed with a protrusion 70b and a cutout 70c idential to the protrusion 44b and cutout 44c. The switch element 70a is further formed with a protrusion 70d integral with the protrusion 70b and adapted to engage with contact 44p when the switch element 70a is in the UHF position as shown in FIG. 2. In this manner, the tuner circuit is tuned to channel 13 since all of the coils 20 to 40 are shorted out by the switch element 70a. The channel 2 component of the VHF input signal will be effectively attenuated by the resonant circuit since the resonant frequency (corresponding to channel 13) is much higher than the channel 2 frequency. Although not shown, the switch element 70a may be adapted to short out the coil 42 also, or alternatively all of the coils in the resonant circuit. In the latter case, attenuation would be total.

Figure 3:
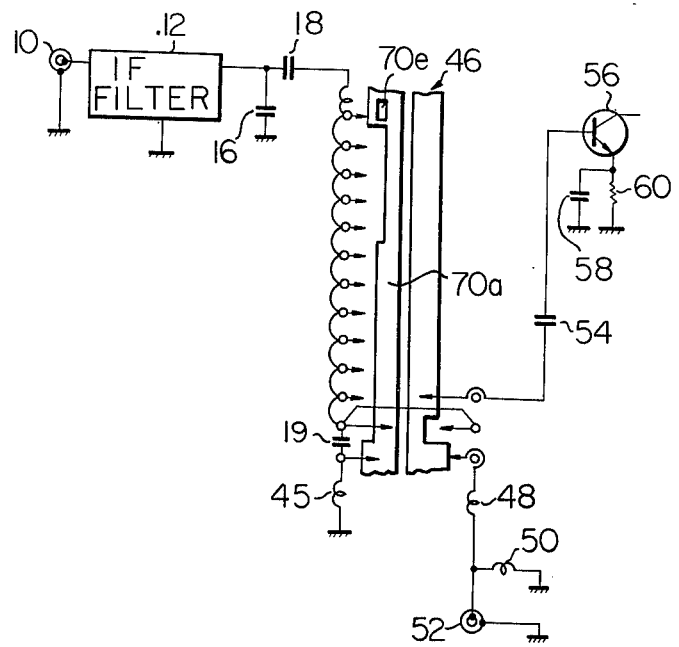
FIG. 3 is similar to FIG. 2 but shows another embodiment.

Due to the attenuation of the channel 2 signal component provided by the present invention, it is possible to eliminate the switch 14 as shown in FIG. 3. In this case, the output of the IF filter 12 is connected directly to the junction of the capacitors 16 and 18.

Figure 5D:
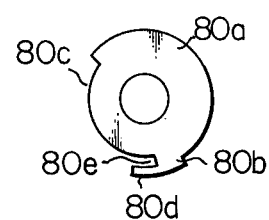

The cutout 70e is provided to prevent the contact 44d from engaging with the switch element 70a when the switch element 70a is in the channel 2 position. As shown in FIG. 5d, the switch element 70a may be replaced by a switch element 80a having a protrusion 80b, a cutout 80c and protrusion 80d performing the same functions as the protrusion 70b, cutout 70c and protrusion 70d. The only differenceis that the cutout 70e is replaced by a slot 80e performing the same function.

Figure 4:
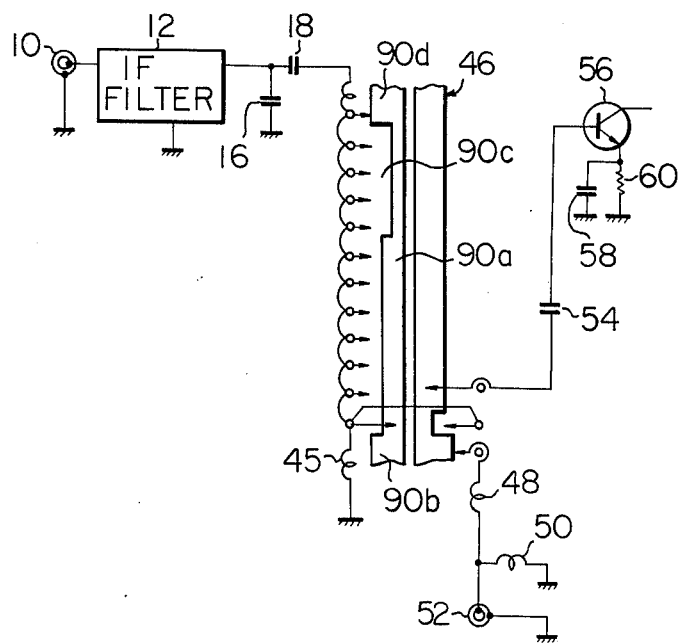
FIG. 4 is similar to FIG. 2, but shows yet another embodiment.

The embodiment of FIG. 4 is similar to that of FIG. 3 except that the wave trap capacitor 19 switch contact 44d are omitted. In this case, a switch element 90a may be provided to replace the switch element 70a which has an identical protrusion 90b and cutout 90c. Due to the elimination of the switch contact 44d, a protrusion 90d may be provided which serves the same function as the protrusion 70d but does not require a cutout or slot.

Figure 6:
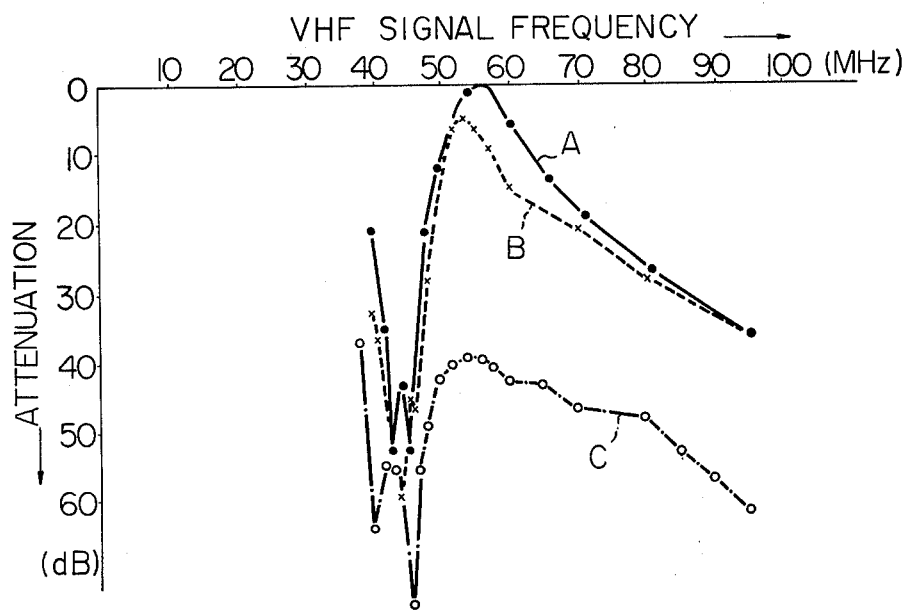
FIG. 6 is a graph illustrating the performance of a television tuner circuit embodying the present invention compared with a prior art television tuner circuit.

The effect of the present invention is illustrated in FIG. 6, in which the various curves represent the attenuation of a VHF input signal as a function of its frequency. A curve A represents the condition in which the resonant circuit is tuned to resonate at the channel 2 frequency. It will be noticed that the attenuation is practically zero at the resonant frequency. A curve B represents the performance of the prior art tuning circuit shown in FIG. 1 when the switches are set to the UHF position. The VHF input signal is inductively coupled to the resonant circuit in spite of the provision of the switch 14. It will be recalled that the resonant circuit is tuned to channel 2 since none of the coils 20 to 42 are shorted out by the switch element 44a. In this manner, the channel 2 component of the VHF input signal is not attenuated satisfactorily by the tuning circuit, and interferes with the UHF IF signal to produce a beat frequency signal.

A curve C represents the performance of the embodiment of the present invention shown in FIG. 2. It will be seen that the attenuation of the channel 2 component of the VHF input signal is about 40 decibels, which is entirely satisfactory in practical applications.

Various modifications will be apparent to those skilled in the art which do not depart from the scope of the present invention. The switch element 70a may be replaced by two separate switch elements, although not shown, one being provided for channel selection and the other for shorting out the coils when selecting UHF. As another modification, a switch may be provided to short out one or more capacitors in the resonant circuit rather than coils. Any means may be provided, within the scope of the invention, which is adapted to either prevent oscillation in the resonant circuit or change the resonant frequency to a value quite different from channel 2 when the tuner is set to receive UHF by shorting out one or more tuning elements.

What is claimed is:

1. In a VHF-UHF television tuner circuit having a VHF tuning element, a VHF signal input connectable to the input of the tuning element, a UHF IF signal input, a signal output, a band switch to selectably connect the signal output alternatively to either the output of the tuning element or the UHF IF signal input, and a channel selection switch connected to control the VHF tuning element and further connected with the band switch, the improvement in which the channel selection switch has channel 2 attenuation means to set the VHF tuning element to one of the channels which is a channel other than channel 2 when the band and channel selection switches are set to their UHF positions and thereby attenuate the channel 2 VHF input signal component and prevent interference by said channel 2 signal component.

2. The tuner circuit according to claim 1 in which the VHF tuning element includes a plurality of inductors connected in series and in which said channel selection switch and said band switch are rotary wafer switches and in which said channel 2 attenuation means is a conductive protrusion on the rotor of said channel selection switch.

3. The tuner circuit according to claim 1 in which the tuning element includes a plurality of inductors connected in series, input and output ends of the series of inductors being connected to the input and output parts of tuning element respectively and in which said channel 2 attenuation means is a conductive protrusion on said channel switch, which protrusion selectively connects the input end of the series of inductors to the output end of series of inductors when the band switch connects the signal output to the UHF signal input.

4. The tuner circuit according to claim 1, in which the channel selection switch is a rotary wafer switch having its contacts being fixed and the switch element being a rotary wafer.

5. The tuner circuit according to claim 1, in which the channel selection switch is a rotary wafer switch, the contacts being fixed and the switch element being a rotor, the circuit further comprising a wave trap having one part connected to the output end of the series of inductors, the band switch including a contact connected to another part of the wave trap, the channel selection switch rotor being formed with a cutout and a protrusion so that said protrusion connects the parts of the wave trap together only when connecting the contact connected to the output end of the series of inductors to predetermined other of the contacts.

6. The tuner circuit according to claim 1, in which VHF tuning element comprises a plurality of inductors connected in series and the channel selection sets the VHF tuning element to channel 13 by connecting to said inductors and thereby shorting out a portion of the series of inductors.

7. The tuner circuit according to claim 1 and further including a third switch which is a shorting switch and which is operatively connected with the said band and channel selection switches to selectably make connections between the input of the tuning element and the VHF signal input or alternatively to short said VHF signal input to ground.

8. The tuner circuit according to claim 7 in which the said channel selection and shorting switches are rotary wafer switches which turn with each other.

* * * * *